(12) United States Patent
Nelson

(10) Patent No.: US 6,298,737 B1
(45) Date of Patent: Oct. 9, 2001

(54) CERAMIC RING UNDERSIZE DETECTION DEVICE

(75) Inventor: Robert J. Nelson, Sunnyvale, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 710 days.

(21) Appl. No.: 08/654,708

(22) Filed: May 29, 1996

(51) Int. Cl.[7] .................................................. G01N 19/00
(52) U.S. Cl. ............................................................ 73/865.9
(58) Field of Search ............................. 73/865.9, 865.8, 73/1 J, 1.01

(56) References Cited

U.S. PATENT DOCUMENTS

| | | | |
|---|---|---|---|
| 4,429,464 | * | 2/1984 | Burrus ..................................... 73/1 J |
| 4,628,991 | * | 12/1986 | Hsiao et al. ......................... 73/865.9 |
| 4,744,713 | * | 5/1988 | Hrovath ................................ 414/222 |
| 4,772,846 | * | 9/1988 | Reeds ................................. 324/158 F |
| 5,436,790 | * | 7/1995 | Blake et al. .......................... 361/234 |
| 5,460,703 | * | 10/1995 | Nulman et al. .................. 204/192.12 |
| 5,468,302 | * | 11/1995 | Thietje ..................................... 134/1 |

* cited by examiner

Primary Examiner—Helen Kwok
Assistant Examiner—Nashmiya Fayyaz
(74) Attorney, Agent, or Firm—Isabelle R. McAndrews

(57) ABSTRACT

The present invention concerns a testing object for use in the testing of a wafer clamp. Wafer clamps are used to hold wafers in position on etchers. If the wafer clamp is worn, the process yield drops due to the heating of the wafer and subsequent photoresist melting. The testing object passes wafer clamps having a sufficient wafer overlap distance, but fails wafer clamps without a sufficient wafer overlap distance.

17 Claims, 5 Drawing Sheets

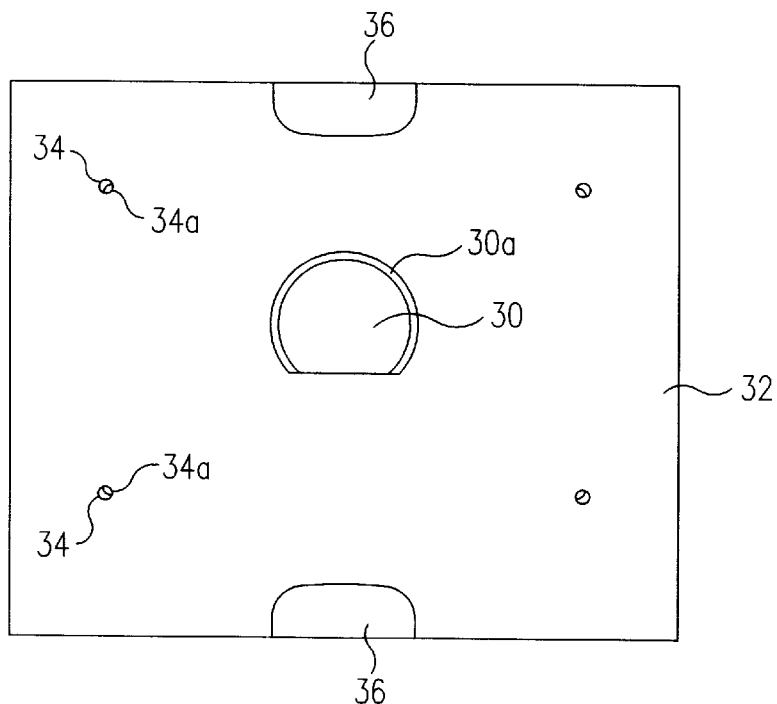
FIG. 3
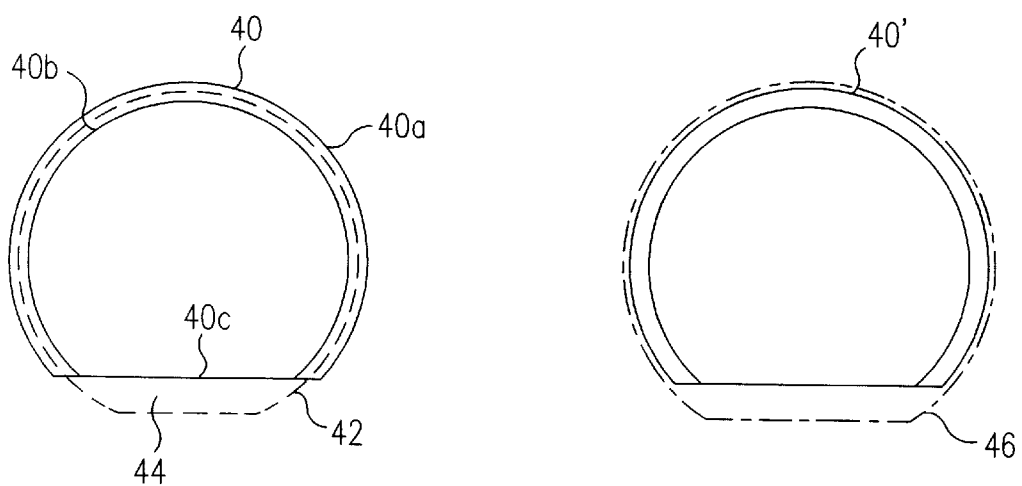
FIG. 4
FIG. 5

CERAMIC RING UNDERSIZE DETECTION DEVICE

BACKGROUND OF THE INVENTION

The present invention relates to the testing and maintenance of semiconductor processing equipment. The present invention especially relates to the testing and maintenance of etching devices.

Etchers such as LAM Research 9600 available from the LAM Research Corporation of Fremont, Calif., use a wafer clamp to hold a wafer in position during processing. FIG. 1 is a partial cross-sectional view of prior etcher 10, including a wafer clamp 12, wafer 14, and bottom electrode 16. This diagram exaggerates the curvature of the bottom electrode 16 and is not to scale. The wafer 14 is positioned in the etcher by a robotic handler (not shown). The wafer clamp 12 comes down and holds the wafer 14 against the bottom electrode 16. An overlap 18 between the wafer clamp 12 and the wafer 14 is usually kept relatively small so that the largest possible area of the wafer 14 is available to be processed. In etchers such as the LAM Research 9600 series, helium gas flows around the back side of the wafer 14 to cool the wafer 14 during the etching.

One problem that has occurred during processing is that the photoresist on the wafer 14 can melt when excess heat accumulates on the wafer 14. Melted photoresist will prevent the circuit pattern from being accurately etched onto the wafer 14. This will cause the failure of the wafer 14. Failure caused by melted photoresist is not immediately noticeable; the wafer 14 will go through additional processing steps and other wafers will be improperly processed in the etcher. The damaged wafers and wasted processing time can produce a considerable expense.

There is thus a need for a better approach for evaluating the extent of wear of a wafer clamp that is more reliable and less cumbersome.

SUMMARY OF THE INVENTION

It has been found that the wearing of the wafer clamp can cause the overlap between the clamp and the wafer to decrease. In most etchers, including LAM Research etchers, helium backside wafer cooling is done by supplying a fixed helium pressure to the backside of the wafer. Heat is transferred from the backside of the wafer to the helium. When the wafer clamp has worn so that the overlap distance between the clamp and the wafer is decreased, a greater amount of the helium gas will leak out at an undesirable rate, thereby adversely affecting the backside cooling of the wafer. The wafer processing machine will in turn increase the level of helium supplied to the backside in order to maintain a fixed pressure. However, the helium will flow past the backside of the wafer too quickly for effective heat transfer. The wafer can heat up to a temperature that causes the resist material to melt, resulting in the failure of the process discussed above.

Worn wafer clamps also contribute to the misalignment of the wafer on the electrode. The misalignment can result in a non-uniform cooling of the wafers affecting the product yield.

The wear on a wafer clamp is generally not noticeable merely with visual inspection. One way to measure the size of the opening on the wafer clamps to detect wear is with calipers. It is difficult for the user to position the calipers so that they correctly measure the inner diameter of the wafer clamp. The use of calipers also relies heavily upon the judgment and skill of the person making the measurement. Therefore, the caliper method does not provide consistent results among different measurements.

The present invention concerns a testing object with a shape that can be used to distinguish between a worn wafer clamp and a wafer clamp that is suitable for use. If the opening of the wafer clamp slips past an upper portion of the testing object, the wafer clamp is considered to be unsuitable for use and is replaced. If the opening of the wafer clamp cannot slip past an upper portion of the testing object, the wafer clamp is considered to be suitable for use in the semiconductor processing machine.

A wafer clamp is determined to be worn when the overlap distance between the wafer and the wafer clamp is reduced from the initial overlap distance. In a preferred embodiment, if the overlap distance of a wafer clamp is reduced to 1 millimeter or less from an initial overlap distance of 1.5 millimeters, the wafer clamp is determined to be worn. The wafer clamp should be removed from the semiconductor processing machine before the overlap distance is reduced to 0.5 millimeters. Wafer clamps with an overlap distance of 0.5 millimeters have been found to cause some of the problems discussed above.

In a preferred embodiment, the testing object is circular except for a chord cut portion. The chord cut portion maintains a gap between the wafer clamp and the testing object at the chord cut portion. This gap ensures that the chord cut portion of the testing object will not affect the wear test.

The testing object preferably has an angled portion which helps position the wafer clamp with the center of the wafer clamp at the center of the testing object. The testing object can also be mounted on a base. The base can include guiding pins which help position the wafer clamp about the testing object.

The testing object can be used to test the wear of wafer clamps as part of the regular maintenance of the semiconductor processing machine. The wafer clamp is removed from the semiconductor processing machine, and placed on the testing object. If the testing object passes through the center of the wafer clamp, the wafer clamp is replaced. If the testing object does not pass through the center of the wafer clamp, the wafer clamp is not replaced, but put back onto the semiconductor processing machine.

BRIEF DESCRIPTION OF THE DRAWINGS

The above and other features of the present invention will become more apparent upon reading the following detailed description in conjunction with the accompanying drawings, in which:

FIG. 3 is a top view of a testing object mounted to a base.

FIG. 4 is a diagram illustrating a testing object and an outline of the opening of a good wafer clamp.

FIG. 5 is a diagram of a testing object along with an illustration of the opening of a worn wafer clamp.

DETAILED DESCRIPTION OF THE DRAWINGS

Figure 1:
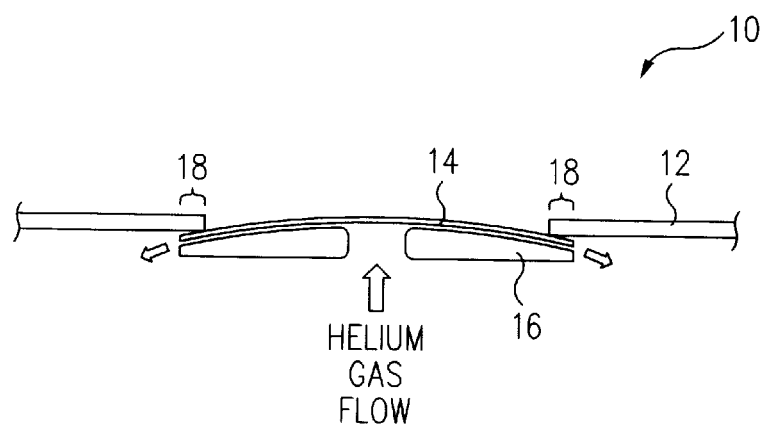
FIG. 1 is a partial cross-sectional diagram of an etching device showing a wafer clamp, a wafer, and the bottom electrode.
Figure 2:
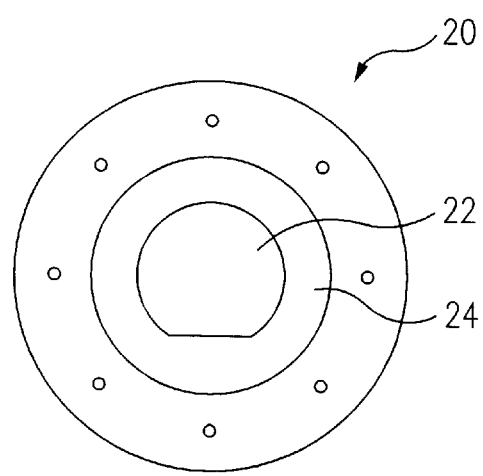
FIG. 2 is a top view of a wafer clamp.

For ease of comprehension, the invention is described below in reference to the LAM Research series 9600 etcher. However, the invention can be applied to any etcher or machine that requires a diagnostic device and method for evaluating worn components before an adverse impact is produced. FIG. 2 is a top view of a wafer clamp for a LAM Research 9600 series etcher. In the preferred embodiment, the wafer clamp is used for a Transformer Coupled Plasma (TCP) etcher. The wafer clamp could be used for a bottom-actuated clamp which pulls the wafer down from the bottom, or a variable gap system which pushes the wafer clamp down from the top. The wafer clamps will have different outer diameters depending upon whether they are used for a bottom-activated clamp or a variable gap system device. The wafer clamp 20 for use with the LAM Research 9600 series is available from Coors Ceramics. The wafer clamp 20 has an opening 22. The ledge section 24 defines the shape of the opening 22. The opening 22 of an unworn wafer clamp has an initial overlap distance between the wafer clamp and the wafer of approximately 1.5 millimeters. The LAM Research 9600 series processes wafers of various different sizes. Testing objects of the present invention can also be used to test wafer clamps used with other size wafers.

FIG. 3 is a top view of a testing object 30 mounted to a base 32. The testing object 30 is preferably made from a material that is softer than aluminum. By using such a relatively soft material for the testing object, the ceramic ledge area of a wafer clamp will not be damaged as it is tested on the testing object. It is possible that the thin ledge area of a wafer clamp could be gradually scraped away if the testing object was fabricated of a hard material, such as aluminum or some other metal. The testing object is also preferably not made of a brittle material or a material that is as ductile as soft rubber. If the ledge area of a wafer clamp becomes sharpened, the risk of cutting through a ductile testing object exists and poses the further risk of masking the true condition of the wafer clamp. One material that has been found to be satisfactory for use as a testing object is Delrin™. Other satisfactory materials for the testing object include Teflon™, hard rubber, plastic and their equivalents.

The testing object 30 includes a tapered area 30a for positioning the wafer clamp onto the testing object 30. Guide pins 34 are optionally attached to the base 32. These guide pins preferably are provided with a tapered area 34a, to facilitate centering the wafer clamp before it contacts the testing object. The testing object need not be mounted onto the base to work. The mounting base merely makes the use of the testing object more convenient. In a preferred embodiment, the base 32 has indented areas 36 which allow the wafer clamp to be easily removed from the base 32.

FIG. 4 is a diagram showing the testing object 40 and an illustration of an opening 42 of a good wafer clamp. Note that, a good wafer clamp does not slip over the edge 40a of the testing object. There is a gap 44 between the edge of the opening 42 and the testing object 40. This gap allows for ease in milling the testing object 40. Because the bottom edge 40c does not contact the wafer clamp, the bottom edge 40c need not be precisely milled. The testing object 40 also includes the top edge 40b, which as discussed above aids in the ease of positioning the wafer clamp onto the testing object. The angled portion between edge 40a and 40b is best seen in FIG. 6 described below.

FIG. 5 is a diagram illustrating a testing object 40' and the opening 46 of a worn wafer clamp. Note that the opening 46 of the worn wafer clamp will slip past the testing object 40'.

Figure 6:
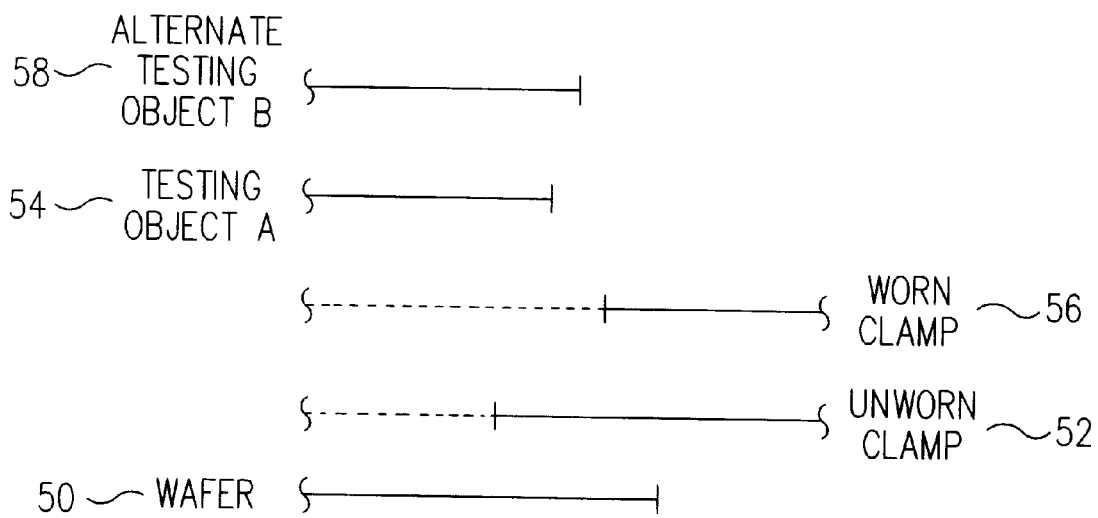
FIG. 6 is a diagram illustrating the relationship between the wafer clamp and wafer, overlap, and the object and hole diameters.

FIG. 6 is a diagram illustrating the relationship between the overlap distance, the testing object diameter, and the wafer clamp opening diameter. This diagram illustrates a preferred embodiment in which wafer clamps used with 150 millimeter wafers are being tested. As the skilled artisan can appreciate, the present invention can be applied to larger or smaller sized wafers. An unworn clamp 52 has an opening 147 millimeters in diameter, and overlaps wafer 50 by 1.5 millimeters. Testing object A, 54, is shown with a 148 millimeter diameter. The worn clamp 56 will slip past an upper portion of the testing object A, 54, but the unworn clamp 52 will not slip past an upper portion of the testing object A, 54. The opening of the worn clamp 56 is 149 millimeters in diameter, corresponding to a 0.5 millimeter overlap of the worn clamp with the wafer. The choice of 148 millimeters for the diameter of the testing object A has the advantage that wafer clamps with a wafer overlap distance of 1.0 millimeters or less will fail, while wafer clamps having a wafer overlap distance greater than 1.0 millimeters will pass.

In a preferred embodiment, the diameter of the testing object is between 147 millimeters and 150 millimeters. A diameter of 150 millimeters corresponds to no overlap between the wafer and the wafer clamp. A diameter of 147 millimeters corresponds to the initial overlap distance of 1.5 millimeters between a wafer and the wafer clamp.

Note that the worn clamp 56 will slip past an upper portion of an alternate testing object B, 58, but the unworn clamp 52 will not slip past an upper portion of the alternate testing object B, 58. The alternate testing object B, 58, has a 148.5 millimeter diameter. The advantage of the testing object A, 54, over the alternate testing object B, 58, is that the testing object A, 54, provides a greater margin of error. This greater margin of error is useful if the wafer clamp is substantially worn by use in the semiconductor processing machine between the regular maintenance periods.

In FIG. 6, the scale for the overlap in millimeters is different than the scale for the diameter in millimeters. This results from the objects, wafer clamps and wafer shown being centered about a point that corresponds to a zero diameter. Thus, $$\text{overlap distance} = \frac{\text{wafer diameter} - \text{wafer clamp opening diameter}}{2}$$

Figure 7:
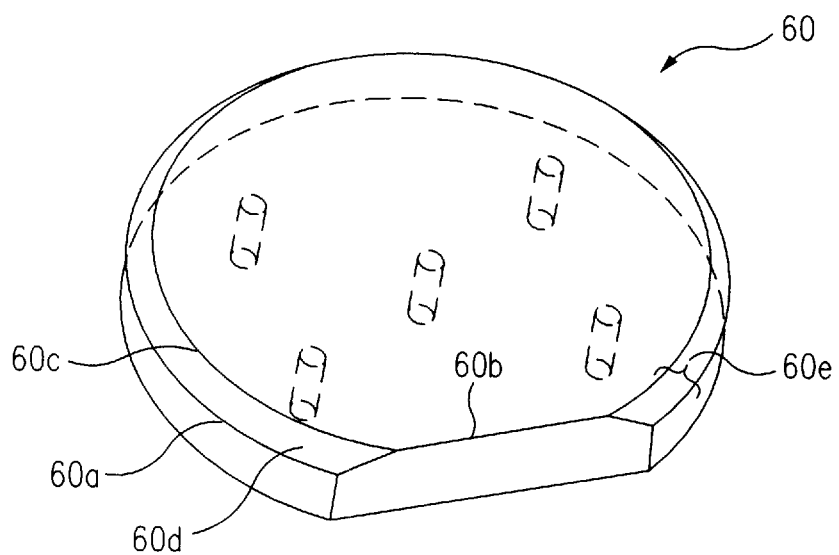
FIG. 7 is a diagram of a preferred embodiment of a testing object.

FIG. 7 shows a preferred embodiment of the testing object 60. Between the inner edge 60c and the outer edge 60a is an angled portion 60d. The angled portion 60d in a preferred embodiment has a 45° angle. The testing object 60 in this preferred embodiment is 0.850 inches high, the angled portion 60d is 0.225 inches high, and the chord at the surface 60b is one-half inch into the diameter at that point. Recessed portions on a surface of the testing object 60 can be provided for mounting purposes.

Wafer clamps are tested to see if they slip through an upper portion 60e of the testing object 60. In a preferred embodiment, the upper portion 60e includes the outer edge 60a. The outer edge 60a defines the largest diameter of the testing object 60. It is possible to have a testing object in which the upper portion 60e does not have the largest diameter of the testing object. For example, the testing object could be stepped so that different levels of wear are indicated. The upper portion also need not include an angled portion.

Figure 8:
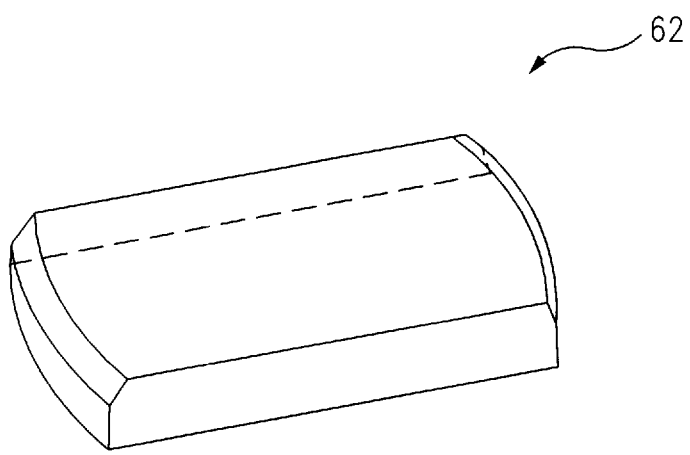
FIG. 8 is a diagram of an alternate embodiment of a testing object.

FIG. 8 is a diagram of an alternate embodiment of a testing object. This alternate embodiment is different than the embodiment shown in FIG. 7, in that the testing object 62 of FIG. 8 includes less of a complete circle. A disadvantage of the testing object 62 is that, unless the wafer clamp is positioned correctly as it is placed upon the testing object 62, one side of the wafer clamp can drop down while the other side of the wafer clamp remains on top of the testing object 62. The fuller shape of the testing object 60 shown in FIG. 7 aids in the positioning of the wafer clamp.

Figure 9:
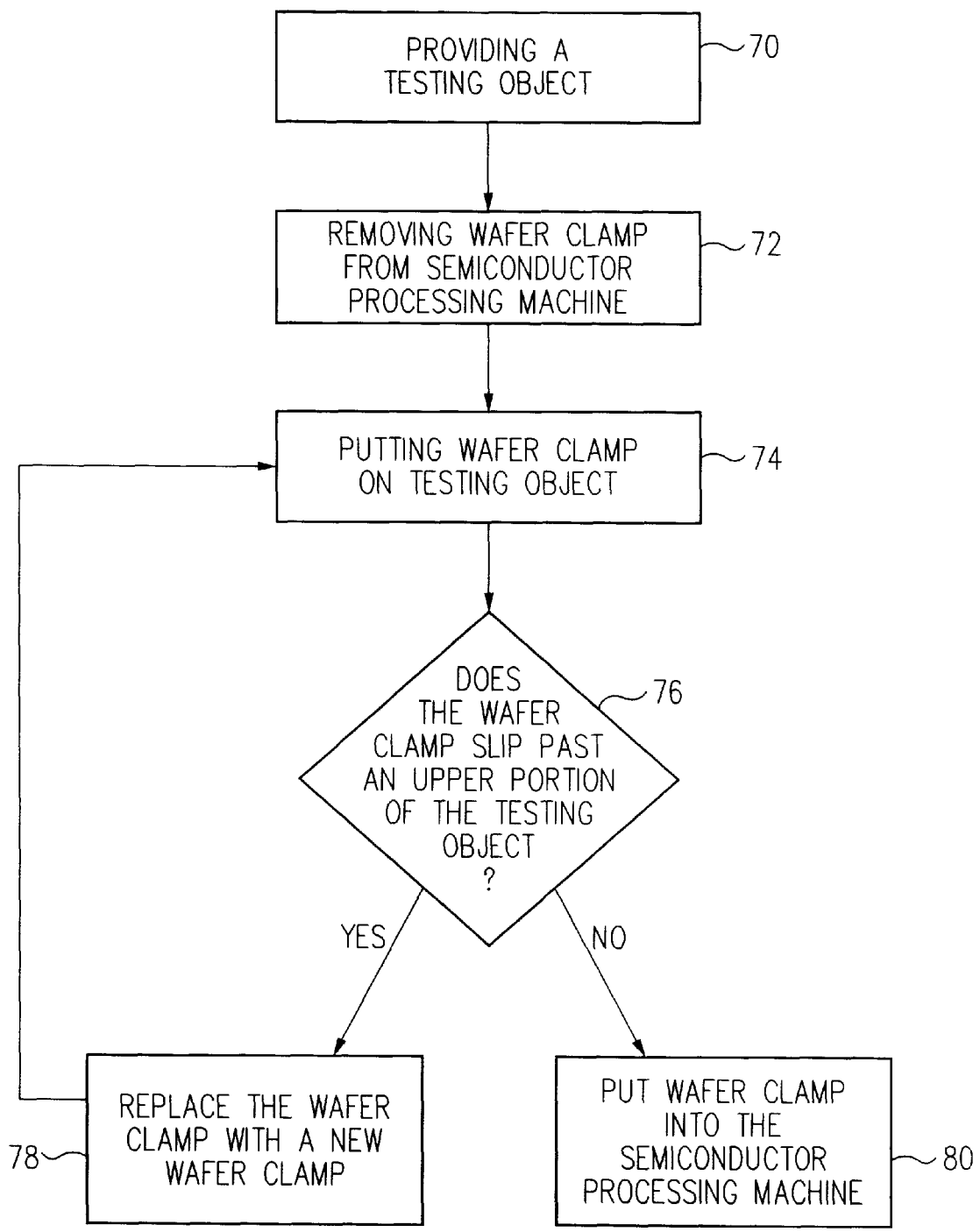
FIG. 9 is a flow chart showing the method of the present invention.

FIG. 9 is a flow chart showing the method of the present invention. The testing object is provided in step 70. In step 72, the wafer clamp is removed from the semiconductor processing machine. As discussed above, this semiconductor processing machine is preferably an etching device such as a LAM Research etcher of the 9600 series. The wafer clamp can be removed as part of the regular testing and maintenance of the etching device. In a preferred embodiment, the wafer clamps are removed after the device processes about two thousand wafers. This results in maintenance about once every ten to fourteen days. In step 74, the wafer clamp is placed onto the testing object. If the wafer clamp can slip past an upper portion of the testing object, the wafer clamp is replaced in step 78. A new wafer clamp can be placed into the semiconductor processing machine. Optionally, this new wafer clamp can be tested before being placed into the semiconductor processing machine. If the wafer clamp cannot slip past an upper portion of the testing object, the wafer clamp is returned to the semiconductor processing machine in step 80.

Various details of the implementation and method are merely illustrative of the invention. It will be understood that various changes in such details may be within the scope of the invention, which is to be limited only by the appended claims.

What is claimed is:

1. A wear testing system for a wafer clamp, the wafer clamp designed to hold a wafer of a predetermined size, the wafer clamp having a ledge portion around an opening, the ledge portion having an overlap region that overlaps the edge of the wafer by an initial overlap distance to hold the wafer in place during processing, the wear testing system comprising:

a testing object having a shape that prevents the wafer clamp from slipping past an upper portion of the testing object when the clamp has not been worn, and a shape that permits a wafer clamp that is worn to slip past said upper portion.

2. The wear testing system of claim 1, wherein a wafer clamp is determined to be worn when said overlap region is reduced to provide an overlap distance that is less than the initial overlap distance.

3. The wear testing system of claim 2, wherein a wafer clamp is determined to be worn when said overlap region is reduced to provide an overlap distance of 1 mm or less.

4. The wear testing system of claim 2, wherein a wafer clamp is determined to be worn when said overlap region is reduced to provide an overlap distance of 0.5 mm or less.

5. The wear testing system of claim 1, wherein the testing object is made of a synthetic material softer than aluminum.

6. The wear testing system of claim 1, wherein the testing object is mounted on a base.

7. The wear testing system of claim 6, wherein the base has guide pins to aid in the positioning of the wafer clamp during testing.

8. The wear testing system of claim 1, wherein the testing object includes an angled portion.

9. The wear testing system of claim 1, wherein the upper portion of the testing object has a width less than 150 mm and more than 147 mm.

10. The wear testing system of claim 1, wherein the testing object has a shape to test a wafer clamp with a substantially circular opening.

11. The wear testing system of claim 10, wherein the testing object has a shape to test a wafer clamp with a substantially circular opening that has a chord portion, said shape of said testing object providing a gap between the testing object and the substantially circular opening of said wafer clamp.

12. A method of testing the wear of a wafer clamp, the wafer clamp designed to hold a wafer of a pre-determined size, the wafer clamp having a ledge portion around an opening, the ledge portion having an overlap region that overlaps the edge of the wafer by an initial overlap distance to hold the wafer in place during processing, the method comprising:

providing a testing object having a shape that prevents the wafer clamp from slipping past an upper portion of the testing object when the clamp is not worn, wherein the testing object has a shape to permit a wafer clamp that is worn to slip past an upper portion of the testing object even when the wafer clamp still would have some overlap with a wafer; and placing the wafer clamp on the testing object to determine whether the wafer clamp is to be replaced.

13. The method of claim 12, wherein the wafer clamp is determined to be worn if the wafer clamp slips past the upper portion of the testing object.

14. The method of claim 12, further comprising the step of replacing the wafer clamp if the wafer clamp slips past the upper portion of the testing object.

15. The method of claim 12, wherein the wafer clamp is determined to be worn if said overlap region is reduced to provide an overlap distance that is less than the initial overlap distance.

16. A wear testing system for a wafer clamp, the wafer clamp designed to hold a wafer of a predetermined size, the wafer clamp having a ledge portion around an opening, the ledge portion having a region that overlaps the edge of the wafer by an initial overlap distance to hold the wafer in place during processing, the wear testing system comprising:

a testing object having a shape that prevents the wafer clamp from slipping past an angled upper portion of the testing object when the clamp has not been worn.

17. The wear testing system of claim 16 wherein the testing object is shaped to permit a wafer clamp that is worn to slip past the upper portion of the testing object.

* * * * *